United States Patent [19]

Fang

[11] Patent Number: 5,407,788
[45] Date of Patent: Apr. 18, 1995

[54] PHOTORESIST STRIPPING METHOD

[75] Inventor: Treliant Fang, Lawrenceville, N.J.

[73] Assignee: AT&T Corp., Murray Hill, N.J.

[21] Appl. No.: 80,865

[22] Filed: Jun. 24, 1993

[51] Int. Cl.$^6$ ................................................. G03F 7/42
[52] U.S. Cl. ..................................... 430/318; 430/313; 430/329; 134/38; 252/153; 252/DIG. 8
[58] Field of Search ............... 430/256, 313, 318, 325, 430/329, 331; 134/38; 252/153, 158, DIG. 8

[56] References Cited

U.S. PATENT DOCUMENTS 4,518,675  5/1985  Kataoka .............................. 430/329

FOREIGN PATENT DOCUMENTS 61-163342  7/1986  Japan .................................. 430/329

OTHER PUBLICATIONS

DMSO Reaction Solvent Technical Bulletin, No. 105, Gaylord Chemical Corp., Slidell, La., Feb. 1992, p. 20.

*Primary Examiner*—Kathleen Duda
*Attorney, Agent, or Firm*—Roderick B. Anderson

[57] ABSTRACT

The solubility of tetramethylammonium hydroxide pentahydrate in dimethyl sulfoxide is significantly increased by adding to the solution a quantity of dipropyleneglycol monomethylether. This permits up to twelve percent of the tetramethylammonium hydroxide pentahydrate to be dissolved in dimethyl sulfoxide, rather than the maximum of two percent that would otherwise be the case, which enhances the capacity of the solution to strip photoresist. Particularly, if the concentration of dipropyleneglycol monomethylether is in the range of ten to thirty percent, one can obtain both a high stripping rate and a much higher stripping capacity. For example, stripping capacity may be increased from one hundred forty substrates per gallon to six hundred substrates per gallon.

16 Claims, 1 Drawing Sheet

1

PHOTORESIST STRIPPING METHOD

TECHNICAL FIELD

This invention relates to solvents and, more particularly, to solvents used for stripping photoresist.

BACKGROUND OF THE INVENTION

One step in the fabrication of modem electronic devices is the formation of a conductor pattern over a substrate through photolithographic masking and etching. This step employs a photoresist coating over a metal layer which is selectively exposed to actinic light through a mask defining the desired conductor pattern. The photoresist film is developed so that it, in turn, constitutes a mask having openings defining the regions of the conductor to be etched.

One method of assembling integrated circuit devices is to support a number of them on a ceramic substrate to form an assembly known as a hybrid integrated circuit. It is sometimes advantageous to use an electrophoretic resist as the photoresist for patterning the metal conductor pattern on the substrate of a hybrid integrated circuit. An electrophoretic resist is typically an organic chemical, usually polymethylmethacrylate based, which is deposited on the metal coating by an electroplating process. Such resists offer advantages of line-line photolithographic definition as well as physical robustness. After masking and etching of the metal layer to form the conductor pattern, the electrophoretic mask must be removed using a photoresist stripping solvent.

As is set forth in application of T. Fang, Ser. No. 07/874,472, filed Apr. 13, 1992, now U.S. Pat. No. 5,236,552, granted Aug. 17, 1993, a photoresist stripping solvent or "stripper" must meet many different criteria. A developed electrophoretic resist is particularly difficult to strip if it is coated on the titanium surface. Since titanium-copper-titanium metal layers are often used as conductors on hybrid integrated circuits, effective stripping can be difficult. Tetramethylammonium hydroxide pentahydrate in a carrier of dimethyl sulfoxide has been found to be effective for this purpose and meets the other requirements for photoresist stripping solvents. Unfortunately, its stripping capacity is fairly low. That is, only about one hundred forty substrates having dimensions of 11.4×9.5 centimeters can be processed using one entire gallon of stripper before the stripper becomes ineffective. The stripping solvent would be much more commercially practical if its stripping capacity could be increased.

SUMMARY OF THE INVENTION

In accordance with the invention, the solubility of tetramethylammonium hydroxide pentahydrate in dimethyl sulfoxide is significantly increased by adding to the solution a quantity of dipropyleneglycol monomethylether. This permits up to twelve percent of the tetramethylammonium hydroxide pentahydrate to be dissolved in dimethyl sulfoxide, rather than the maximum of two percent that would otherwise be the case, which enhances the capacity of the solution to strip photoresist. Particularly, if the concentration of dipropyleneglycol monomethylether is in the range of tent to thirty percent, one can obtain both a high stripping rate and a much higher stripping capacity. For example, stripping capacity may be increased from one hundred forty substrates per gallon to six hundred substrates per gallon.

These and other objects, features, and benefits of the invention will be better understood from a consideration of the following detailed description taken in conjunction with the accompanying drawing.

DETAILED DESCRIPTION

Figure 1:
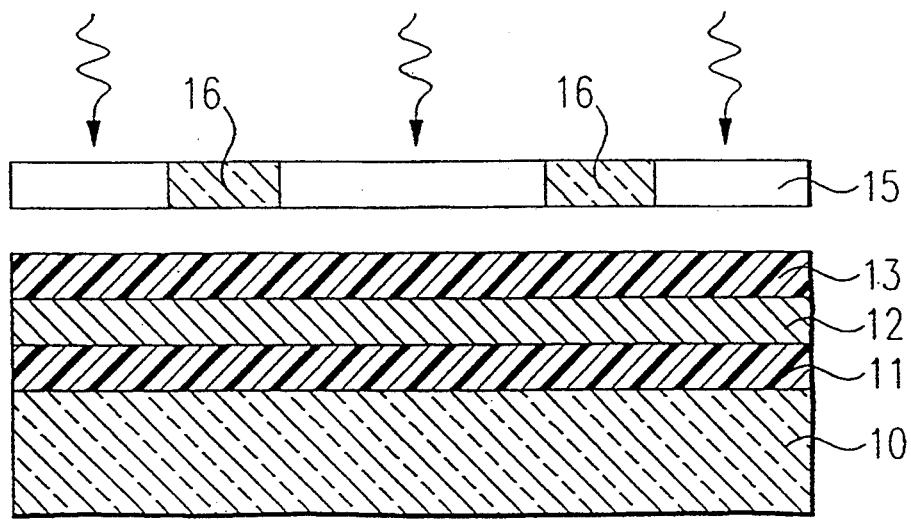
FIGS. 1, 2 and 3 are schematic views of part of a hybrid integrated circuit at successive stages of its fabrication.

The drawings are not intended to be to scale and have been somewhat distorted to aid in clarity of exposition. Referring now to FIG. 1, there is shown, for illustrative purposes, part of a hybrid integrated circuit comprising a ceramic substrate 10 having on one surface a polymer coating 11. A metal layer 12 overlies the polymer coating which in turn is covered by a layer 13 of photoresist. The photoresist 13 is illustratively an electrophoretic photoresist deposited by an electroplating process; it may, for example, be a polymethylmethacrylate-based polymer photoresist such as the photoresist known by the tradename Shipley XP8945, available from the Shipley Company, of Newton, Mass.

Situated over the photoresist coating 13 is a photolithographic mask 15 having opaque regions 16. Photoresist 13 is a type known as a negative photoresist, which means the portion not exposed to light is eventually removed through developing. Thus, it is intended that the transparent portions of the mask 15 through which light is transmitted, as shown by the arrows, corresponds in configuration to the desired configuration of the metal layer 12 to be defined. Exposure to the light cures the portion of the photoresist layer 13 which makes it physically hard and resistant to the developing process.

Figure 2:
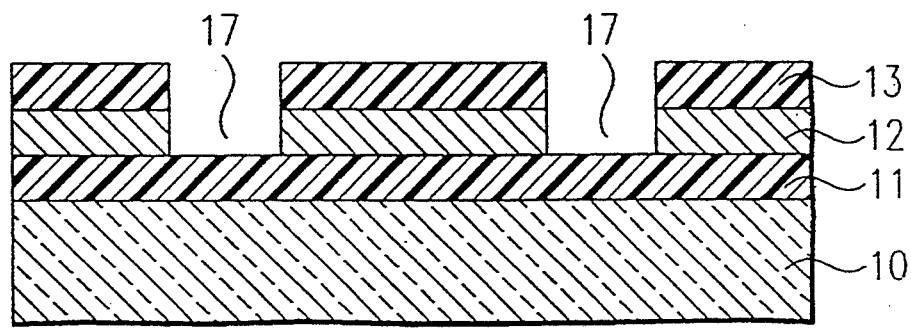

Referring to FIG. 2, the uncured portion of photoresist layer 13, that is, the portion not exposed to light, is removed through the process of developing the photoresist. A common developer comprises aqueous lactic acid. The developed layer 13 then constitutes a mask for permitting selective etching of the metal layer 12. That is, exposed portions of the metal layer 12 are contacted in a known manner with a metal etchant and etched away, while leaving the remaining metal layer intact, thereby producing openings 17 in the metal layer. After selective etching of the metal layer 12, the cured photoresist mask 13 is removed preferably in a bath as shown in FIG. 3.

Figure 3:
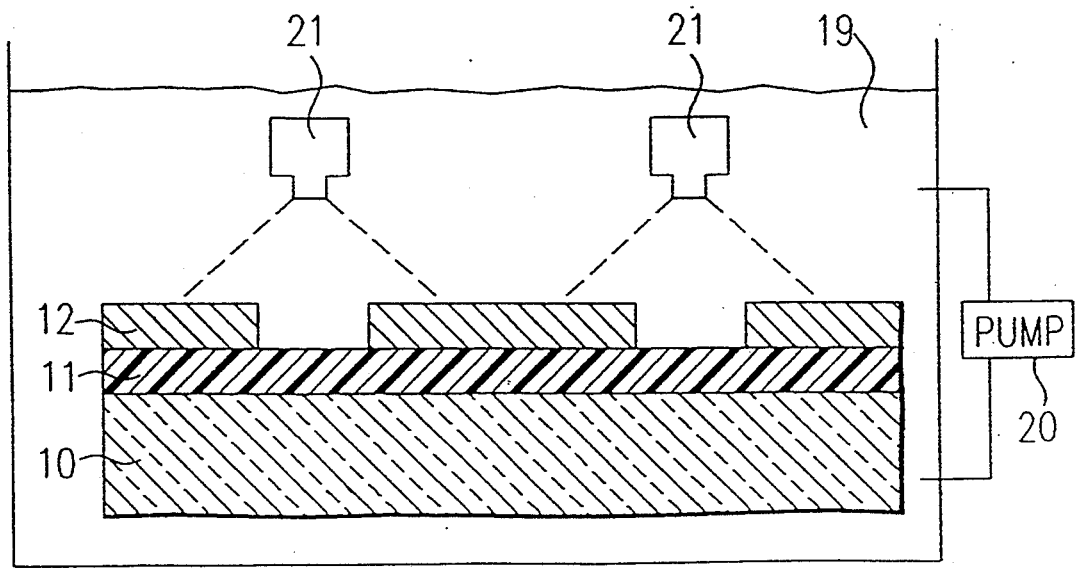

The bath 19 of FIG. 3 comprises a known stripping solvent comprising tetramethylammonium hydroxide pentahydrate dissolved in dimethyl sulfoxide. This stripping solvent is effective even if the upper surface of metal layer 12 is titanium, which is particularly adherent to the cured electrophoretic resist 13. Further, the solvent is relatively unreactive with, and therefore does not damage, polymer 11. In all of my experiments, polymer layer 11 was a triazine-based polymer of the type described in the Small U.S. Pat. No. 4,601,974, granted Jul. 22, 1986. Tetramethylammonium hydroxide pentahydrate also has flashpoint, environmental hazard, and health hazard characteristics which make it practical for use as a photoresist stripping solvent.

A problem with using tetramethylammonium hydroxide pentahydrate in dimethyl sulfoxide as a stripping solvent is that it has a rather limited capacity.

Because of this limited capacity, only about one hundred forty substrates having dimensions of 11.4×9.5 centimeters could be stripped with one gallon of the stripper solvent. In accordance with the invention, I have found that this stripping capacity dramatically increases with the addition of dipropyleneglycol monomethylether which enhances the solubility of tetramethylammonium hydroxide in dimethyl sulfoxide. Preferably, enough dipropyleneglycol monomethylether and tetramethylammonium hydroxide pentahydrate should be added to the commercially available solution that about twenty-one percent of the solution is dipropyleneglycol monomethylether, and about 9.7 percent is tetramethylammonium hydroxide pentahydrate. With this addition, the stripping capacity of the bath 19 increases from one hundred forty substrates to six hundred substrates per gallon of stripper used.

I believe the reason for enhanced efficacy of the improved mixture is that dipropyleneglycol monomethylether acts as a cosolvent, which dramatically increases the solubility of the tetramethylammonium hydroxide pentahydrate in dimethyl sulfoxide. Consequently, a greater portion of the tetramethylammonium hydroxide pentahydrate can be included in the solution and is available for reaction with the cured photoresist, than would otherwise be the case. The invention, however, is based on my experimental findings, and is not to be limited to any particular theory of operation. My experiments further indicate that to obtain a significant benefit, at least ten percent of the mixture should be dipropyleneglycol monomethylether, and to avoid a significant reduction in stripping rate, the dipropyleneglycol monomethylether component should be less than thirty percent. The most effective range for the dipropyleneglycol monomethylether is the range of fifteen percent to twenty-seven percent with, as mentioned before, about twenty-one percent being preferred.

The amount of tetramethylammonium hydroxide pentahydrate that can be dissolved in the solution is a function of the amount of dipropyleneglycol monomethylether that is used. If twenty-one percent of dipropyleneglycol monomethylether is used, about 9.7 percent of the solution may be tetramethylammonium hydroxide pentahydrate. If thirty percent of the solution is dipropyleneglycol monomethylether, about twelve percent may be tetramethylammonium hydroxide pentahydrate. Without any dipropyleneglycol monomethylether component, only about two percent of the tetramethylammonium hydroxide pentahydrate will dissolve in the dimethyl sulfoxide.

The metal layer 12 that was used in the experiments was a layer having an upper surface of titanium, a lower surface of titanium and a middle portion of copper, known as a TCT (for titanium-copper-titanium) layer. Because of the greater adherence of the cured photoresist 13 to a titanium surface than to other commonly used metal surfaces, the photoresist stripper of my aforementioned copending application was found not to be practical.

The active ingredient in the stripper that removes the photoresist is tetramethylammonium hydroxide. The most practical source of this is tetramethylammonium hydroxide pentahydrate, which is about fifty percent by weight water. It is to be understood that pure tetramethylammonium hydroxide could be used as described above and that its effectiveness by weight would be double that of tetramethylammonium hydroxide pentahydrate. That is, a solution of four percent by weight tetramethylammonium hydroxide would have the same stripping capabilities as a solution of approximately eight percent tetramethylammonium hydroxide pentahydrate. Without the invention, the stripper can comprise only about one percent tetramethylammonium hydroxide, and with the invention it can comprise up to six percent tetramethylammonium hydroxide.

The invention was used to strip a particular kind of electrophoretic photoresist that is used on a product made by AT&T, but various other photoresists are sufficiently chemically close to this photoresist that the stripping action of the solvent described would be effective. Various other underlying polymers other than that described for polymer 11 may be used, or no polymer layer may be used. The invention is useful wherever photolithography is used to define areas for selective treatment, of which the etching of metal layer 12 should be considered as only one example. While the invention is particularly useful with metal layers of titanium-copper-titanium, the invention is useful in conjunction with other metal layers, or for photolithography methods that do not use metal layers. Various other embodiments and modifications may be made by those skilled in the art without departing from the spirit and scope of the invention.

I claim:

1. An improved method for making an electronic device comprising the steps of:
   coating part of a substrate with a photoresist coating;
   selectively exposing the photoresist to actinic light;
   developing the photoresist coating in accordance with said selective exposure to actinic radiation;
   using the developed photoresist coating as a mask to permit selective operation on part of the underlying substrate;
   and removing the developed photoresist coating by exposing the coating to a solution comprising tetramethylammonium hydroxide and dimethyl sulfoxide;
   wherein the improvement comprises:
   including dipropyleneglycol monomethylether in said solution;
   and increasing the proportion of tetramethylammonium hydroxide in the solution beyond that which could be dissolved in the absence of dipropyleneglycol monomethylether.

2. The method of claim 1 wherein:
the photoresist is an electrophoretic photoresist.

3. The method of claim 1 wherein:
the substrate comprises a metal coating on a solid body;
and the photoresist is coated on the metal layer.

4. The method of claim 3 wherein:
the step of selectively operating on the substrate comprises the step of selectively etching said metal coating.

5. The method of claim 4 wherein:
the upper surface of the metal comprises titanium.

6. The method of claim 4 wherein:
the solution contains ten to thirty percent dipropyleneglycol monomethylether.

7. The method of claim 1 wherein:
the solution contains ten to thirty percent dipropyleneglycol monomethylether.

8. The method of claim 7 wherein:
the photoresist is an electrophoretic photoresist.

9. The method of claim 8 wherein:

the electrophoretic photoresist is coated on a metal layer.

10. The method of claim 9 wherein:

the metal layer is coated on a polymer layer.

11. The method of claim 10 wherein:

the polymer layer is a triazine-based polymer and the photoresist is a polymethyl methacrylate-based polymer.

12. The method of claim 11 wherein:

the metal layer comprises a lower layer of titanium, a middle layer of copper, and an upper layer of titanium, the lower titanium layer being coated on the polymer layer, and the electrophoretic photoresist being coated on the upper titanium layer.

13. The method of claim 1 wherein:

the solution contains fifteen to twenty-seven percent dipropyleneglycol monomethylether.

14. The method of claim 1 wherein:

the tetramethylammonium hydroxide is added to the solution by adding tetramethylammonium hydroxide pentahydrate.

15. The method of claim 14 wherein:

the solution contains ten to thirty percent tetramethylammonium hydroxide dipropyleneglycol monomethylether and two to twelve percent tetramethylammonium hydroxide pentahydrate.

16. The method of claim 14 wherein:

the solution consists of about 9.7% tetramethylammonium hydroxide pentahydrate, about twenty-one percent dipropyleneglycol monomethylether and about 69.3% dimethyl sulfoxide.

* * * * *